(12) United States Patent
Huang

(10) Patent No.: US 10,249,699 B2
(45) Date of Patent: Apr. 2, 2019

(54) ORGANIC LIGHT EMITTING DIODE SUBSTRATE, METHOD OF FABRICATING THE SAME AND DISPLAY APPARATUS HAVING THE SAME

(71) Applicant: BOE TECHNOLOGY GROUP CO., LTD., Beijing (CN)

(72) Inventor: Wei Huang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/578,890

(22) PCT Filed: May 24, 2017

(86) PCT No.: PCT/CN2017/085700
§ 371 (c)(1),
(2) Date: Dec. 1, 2017

(87) PCT Pub. No.: WO2018/006662
PCT Pub. Date: Jan. 11, 2018

(65) Prior Publication Data
US 2018/0301516 A1 Oct. 18, 2018

(30) Foreign Application Priority Data
Jul. 7, 2016 (CN) .......................... 2016 1 0532406

(51) Int. Cl.
*H01L 27/32* (2006.01)
*H01L 21/77* (2017.01)
(Continued)

(52) U.S. Cl.
CPC .......... *H01L 27/3276* (2013.01); *G06F 3/044* (2013.01); *G06F 3/0412* (2013.01);
(Continued)

(58) Field of Classification Search
CPC . H01L 27/32; H01L 27/3225; H01L 27/3237; H01L 27/3241; H01L 27/3244;
(Continued)

(56) References Cited

U.S. PATENT DOCUMENTS 9,647,042 B2    5/2017  Li et al.
9,648,042 B2 *  5/2017  Cho ..................... G06F 21/6281
(Continued)

FOREIGN PATENT DOCUMENTS

CN    102903423 A    1/2013
CN    103578287 A    2/2014
(Continued)

OTHER PUBLICATIONS

First Office Action dated Jun. 4, 2018 in corresponding Chinese Patent Application No. 201610532406.3.
(Continued)

*Primary Examiner* — Eduardo A Rodela
(74) *Attorney, Agent, or Firm* — Nath, Goldberg & Meyer; Joshua B. Goldberg

(57) ABSTRACT

An organic light emitting diode substrate, a method of fabricating the same, and a display apparatus having the same are disclosed. The organic light emitting diode substrate includes a base substrate, an organic electroluminescence unit on the base substrate, a thin film encapsulation layer on the organic electroluminescence unit, and a plurality of first electrodes and a plurality of second electrodes in the thin film encapsulation layer. The thin film encapsulation layer includes N numbers of inorganic film layers and N numbers of organic film layers that are alternately stacked on the organic electroluminescence unit along a direction away from the base substrate. The plurality of first electrodes are embedded in one of the N numbers of organic film layers, and the plurality of second electrodes are embedded in (Continued)

another one of the N numbers of organic film layers. The present invention is suitable for flexible display panels.

20 Claims, 5 Drawing Sheets

(51) Int. Cl.
H01L 51/52 (2006.01)
H01L 51/56 (2006.01)
G06F 3/041 (2006.01)
G06F 3/044 (2006.01)

(52) U.S. Cl.
CPC .............. *H01L 21/77* (2013.01); *H01L 27/32* (2013.01); *H01L 27/323* (2013.01); *H01L 27/3246* (2013.01); *H01L 27/3253* (2013.01); *H01L 27/3258* (2013.01); *H01L 27/3288* (2013.01); *H01L 27/3297* (2013.01); *H01L 51/52* (2013.01); *H01L 51/5256* (2013.01); *H01L 51/56* (2013.01); *G06F 2203/04103* (2013.01)

(58) Field of Classification Search
CPC .............. H01L 27/3246; H01L 27/3248; H01L 27/3251; H01L 27/3253; H01L 27/3258; H01L 27/326; H01L 27/3276; H01L 27/3283; H01L 27/3288; H01L 27/3295; H01L 27/3297; H01L 51/5203; H01L 51/5237

See application file for complete search history.

(56) References Cited

U.S. PATENT DOCUMENTS

| 2002/0140643 | A1* | 10/2002 | Sato ................... G09G 3/3233 345/76 |
| 2014/0116754 | A1* | 5/2014 | Gao ....................... G06F 3/044 174/250 |
| 2015/0001474 | A1* | 1/2015 | Park .................... H01L 51/5271 257/40 |
| 2015/0280170 | A1* | 10/2015 | Harikrishna Mohan ................... H01L 27/3258 257/40 |
| 2016/0062520 | A1 | 3/2016 | Choi |

FOREIGN PATENT DOCUMENTS

| CN | 103579287 | A | 2/2014 |
| CN | 104576704 | A | 4/2015 |
| CN | 104750285 | A | 7/2015 |
| CN | 105097883 | A | 11/2015 |
| CN | 105390526 | A | 3/2016 |
| CN | 105977279 | A | 9/2016 |
| CN | 106252526 | A | 12/2016 |
| CN | 205789983 | U | 12/2016 |
| CN | 106293258 | A | 1/2017 |

OTHER PUBLICATIONS

International search report dated Sep. 1, 2017 for corresponding International application No. PCT/CN2017/085700 with English translation attached.

* cited by examiner

US 10,249,699 B2

ORGANIC LIGHT EMITTING DIODE SUBSTRATE, METHOD OF FABRICATING THE SAME AND DISPLAY APPARATUS HAVING THE SAME

CROSS-REFERENCE TO RELATED APPLICATIONS

This is a National Phase application filed under 35 U.S.C. 371 as a national stage of PCT/CN2017/085700, filed on May 24, 2017, an application claiming the benefit of Chinese Application No. 201610532406.3, filed on Jul. 7, 2016, the content of each of which is hereby incorporated by reference in its entirety.

TECHNICAL FIELD

The present disclosure relates to the field of display technology, and particularly to an organic light emitting diode substrate, a method of fabricating the same, and a display apparatus having the same.

BACKGROUND

In the field of electro-optic display technology, organic light emitting diode (OLED for short) devices have advantages such as self-illumination, high brightness, high contrast ratio, ultra thin, low power consumption, wide viewing angle, wide operating temperature range and the like, and thus the OLED display is one of advanced flat panel display apparatuses that has been widely used.

However, due to inherent characteristics of organic materials, the OLED device is prone to absorb oxygen and moisture, and is easily to be damaged and deteriorated after being corroded by the oxygen and moisture, thereby severely affecting the service life of the device. Therefore, the requirement on the encapsulation of the OLED device is strict.

SUMMARY

In an aspect, the present disclosure provides an organic light emitting diode (OLED) substrate, including a base substrate, an organic electroluminescence unit on the base substrate, a thin film encapsulation layer on the organic electroluminescence unit, and a plurality of first electrodes and a plurality of second electrodes in the thin film encapsulation layer. The thin film encapsulation layer includes N numbers of inorganic film layers and N numbers of organic film layers, where N is an integer equal to or larger than 2. The N numbers of inorganic film layers and the N numbers of organic film layers are alternately stacked on the organic electroluminescence unit along a direction away from the base substrate, and each of the N numbers of organic film layers is stacked on a respective one of the N numbers of inorganic film layers. The plurality of first electrodes are embedded in one of the N numbers of organic film layers, and the plurality of second electrodes are embedded in another one of the N numbers of organic film layers.

Optionally, the one organic film layer is provided with a plurality of first grooves and the another one organic film layer is provided with a plurality of second grooves. The plurality of first grooves and the plurality of second grooves are arranged such that orthographic projections of the plurality of first grooves on the base substrate intersect with orthographic projections of the plurality of second grooves on the base substrate. Each of the plurality of first grooves is filled with a respective one of the plurality of first electrodes, and each of the plurality of second grooves is filled with a respective one of the plurality of second electrodes.

Optionally, the OLED substrate further includes a pixel definition layer on the base substrate, and the pixel definition layer defines the organic electroluminescence unit. An orthographic projection of the pixel definition layer on the base substrate completely covers the orthographic projections of the plurality of first electrodes and the plurality of second electrodes on the base substrate.

Optionally, the organic electroluminescence unit includes an anode layer, a light emitting layer and a cathode layer;

the anode layer is on the base substrate, the pixel definition layer is on the anode layer and has an opening to expose a portion of the anode layer, the light emitting layer is within the opening of the pixel definition layer and on the portion of the anode layer exposed by the opening, and the cathode layer is on the pixel definition layer and the light emitting layer; alternatively, the cathode layer is on the base substrate, the pixel definition layer is on the cathode layer and has an opening to expose a portion of the cathode layer, the light emitting layer is within the opening of the pixel definition layer and on the portion of the anode layer exposed by the opening, and the anode layer is on the pixel definition layer and the light emitting layer.

Optionally, any two adjacent second electrodes are spaced by a distance of 100 μm to 2000 μm in a horizontal direction.

Optionally, each of the first and second grooves has a width of 3 μm to 20 μm.

Optionally, each of the first and second grooves has a depth of 1 μm to 5 μm.

Optionally, the first electrodes and the second electrodes include at least one of silver, gold, copper and aluminium.

Optionally, the organic film layer has a thickness of 3 μm to 12 μm.

Optionally, the inorganic film layer has a thickness of 0.2 μm to 1.0 μm.

Optionally, N is equal to or larger than 3, the N numbers of inorganic film layers and the N numbers of organic film layers are alternately stacked on the organic electroluminescence unit along the direction away from the base substrate in an order of 1 to N, the first electrodes are in an (N−1)-th organic film layer, and the second electrodes are in an N-th organic film layer.

Optionally, the N numbers of inorganic film layers and the N numbers of organic film layers are alternately stacked on the organic electroluminescence unit along the direction away from the base substrate in an order of 1 to N, and the OLED substrate further includes a protective layer on an N-th organic film layer.

Optionally, the protective layer is an inorganic film layer or an organic film layer.

In another aspect, the present disclosure provides a method of fabricating the above organic light emitting diode (OLED) substrate, including steps of:

forming the organic electroluminescence unit and the pixel definition layer on the base substrate; and forming, on the organic electroluminescence unit, the thin film encapsulation layer, and the plurality of first electrodes and the plurality of second electrodes in the thin film encapsulation layer.

The step of forming the thin film encapsulation layer, the plurality of first electrodes and the plurality of second electrodes includes steps of:

forming the N numbers of inorganic film layers and the N numbers of organic film layers on the organic electroluminescence unit in a manner of alternately stacking the inorganic film layers and the organic film layers along the direction away from the base substrate;

forming, after formation of one of the N numbers of organic film layers and before formation of one of the N numbers of inorganic film layers that is directly stacked on the one organic film layer, the plurality of first grooves in the one organic film layer, and forming, in each first groove, a respective one of the plurality of first electrodes; and forming, after formation of another one of the N numbers of organic film layers and before formation of another one of the N numbers of inorganic film layer that is directly stacked on the another one organic film layer, the plurality of second grooves in the another one organic film layer, the plurality of first grooves and the plurality of second grooves being formed so that orthographic projections of the plurality of first grooves on the base substrate intersect with orthographic projections of the plurality of second grooves on the base substrate, and forming, in each first groove, a respective one of the plurality of second electrodes.

Optionally, the step of forming the organic film layer includes forming the organic film layer by ink-jet printing method.

Optionally, the step of forming the plurality of first grooves in the one organic film layer includes forming the plurality of first grooves in the one organic film layer by performing an imprinting process on a surface of the one organic film layer distal to the base substrate; and the step of forming the plurality of second grooves in the another one organic film layer includes forming the plurality of second grooves in the another one organic film layer by performing an imprinting process on a surface of the another one organic film layer distal to the base substrate.

Optionally, the imprinting process is performed in a nitrogen ($N_2$) environment or a vacuum environment.

Optionally, the step of forming the first electrodes in the first grooves includes steps of:

printing ink of metallic nano-particles in the first grooves by ink-jet printing method;

performing a conductive treatment on the metallic nano-particles to form the first electrodes, by using photon sintering method or laser pulse sintering method; and the step of forming the second electrodes in the second grooves includes steps of:

printing ink of metallic nano-particles in the second grooves by ink-jet printing method; and performing a conductive treatment on the metallic nano-particles to form the second electrodes, by using photon sintering method or laser pulse sintering method.

In another aspect, the present disclosure provides a display apparatus, including any one of the above OLED substrates.

DETAILED DESCRIPTION

To make those skilled in the art better understand the technical solutions of the present disclosure, the present disclosure will be described below in detail in conjunction with the accompanying drawings and specific implementations.

Currently, encapsulation techniques for OLED devices, which include a conventional encapsulation of glass cover (or metal cover) with drier sheet, a face encapsulation, a frit encapsulation, a thin film encapsulation and the like, become increasingly mature. Among those techniques, the thin film encapsulation has prominent advantages in aspects of reducing weight and thickness of the device, reducing quantity of parts for encapsulation and lowering encapsulation cost, reducing edge width of the encapsulation, eliminating dead displaying angle, being rollable and flexible, etc.

On the other hand, an OLED substrate having touch function generally requires additional fabrications of touch electrodes and sensing electrodes on the substrate having OLED devices formed thereon. Conventional touch OLED substrates have low integration level and large thickness, thereby impeding achievements of lighting and thinning of display panels.

Figure 1:
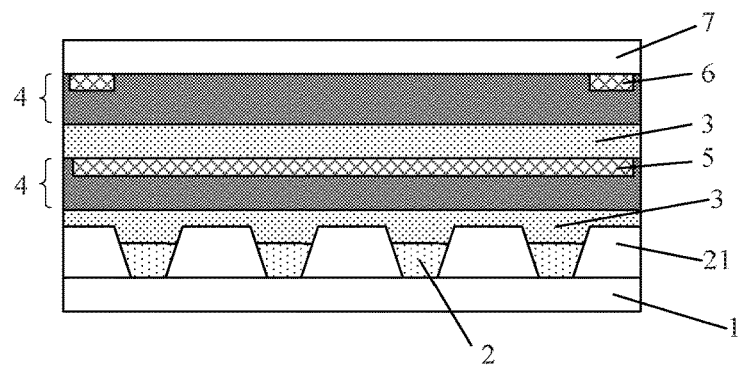
FIG. 1 is a schematic diagram illustrating the structure of an OLED substrate according to embodiments of the present disclosure.
Figure 2:
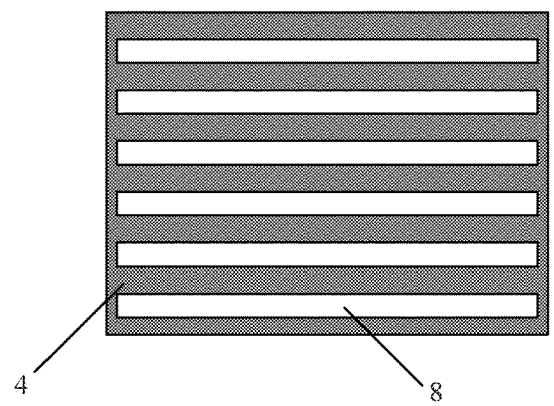
FIG. 2 is a schematic diagram illustrating first grooves of an OLED substrate according to embodiments of the present disclosure.
Figure 3:
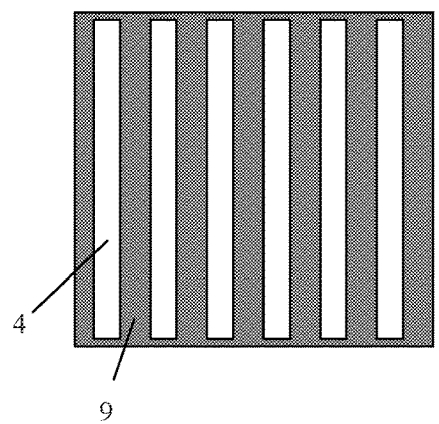
FIG. 3 is a schematic diagram illustrating second grooves of an OLED substrate according to embodiments of the present disclosure.

In an aspect, embodiments of the present disclosure provide an OLED substrate. Referring to FIGS. 1 to 3, the OLED substrate includes a base substrate 1, an organic electroluminescence unit 2 on the base substrate 1, a thin film encapsulation layer on the organic electroluminescence unit 2, and a plurality of first electrodes 5 and a plurality of second electrodes 6 in the thin film encapsulation layer. The thin film encapsulation layer includes N numbers of inorganic film layers 3 and N numbers of organic film layers 4, where N is an integer equal to or larger than 2. The N numbers of inorganic film layers 3 and the N numbers of organic film layers 4 are alternately stacked on the organic electroluminescence unit 2 along a direction away from the base substrate 1, and each of the N numbers of organic film layers 4 is stacked on a respective one of the N numbers of inorganic film layers 3. The plurality of first electrodes 5 are embedded in one of the N numbers of organic film layers 4, and the plurality of second electrodes 6 are embedded in another one of the N numbers of organic film layers 4. The thin film encapsulation layer covers the organic electroluminescence unit 2, such that the organic electroluminescence unit 2 is encapsulated on the base substrate 1. Optionally, the inorganic film layer 3 is a blocking layer to prevent the organic electroluminescence unit 2 from being contaminated by moisture and oxygen, and the organic film layer 4 is a flat layer to provide a planar surface. Particularly, arbitrary two of the plurality of organic film layers 4 may be selected so that a plurality of first grooves 8 are provided in one of the selected two organic film layers 4 and a plurality of second grooves 9 are provided in the other of the selected two organic film layers 4, and orthographic projections of the plurality of first grooves 8 on the base substrate 1 intersect with orthographic projections of the plurality of second grooves 9 on the base substrate 1. Each of the plurality of first grooves 8 is filled with a respective one of the plurality of first electrodes 5, and each of the plurality of second grooves 9 is filled with a respective one of the plurality of second electrodes 6.

It can be understood that one of the first electrode 5 and the second electrode 6 may serve as a touch electrode, while the other one may serve as a sensing electrode. That is to say, in the OLED substrate according to the present embodiment, the touch electrode and sensing electrode of a touch substrate are formed together within the thin film encapsulation layer of an OLED substrate, thereby the OLED substrate having enhanced integration level and various functions. Moreover, by arranging the touch electrodes and the sensing electrodes in the grooves on the organic film layers 4 for thin film encapsulation, the thickness of the OLED substrate may not be increased while a touch function is realized.

In the present embodiment, optionally, each of the first groove 8 and the second groove 9 is of a strip shape. Needless to say, any other shapes may be adopted, such as a pulse shape, a sine wave shape, a sawtooth shape and the like.

It should be noted that, in embodiments of the present disclosure, the OLED substrate according to embodiments of the present disclosure are described by taking that each of the first grooves 8 extends along a row direction and each of the second grooves 9 extends along a column direction as an example, but the present invention is not limited thereto, as long as the first grooves 8 (or the first electrodes 5) and the second grooves 9 (or the second electrodes 6) are arranged such that orthographic projections of the first grooves 8 (or the first electrodes 5) on the base substrate 1 intersect with orthographic projections of the second grooves 9 (or the second electrodes 6) on the base substrate 1.

It can be understood by those skilled in the art that a top-emission type organic electroluminescence unit 2 generally includes an anode layer, a pixel definition layer 21, a light emitting layer (which is provided in an opening of the pixel definition layer 21 and on the portion of the anode layer exposed by the opening), and a cathode layer, which are sequentially arranged on a base substrate 1 in accordance with their fabrication order. On the other hand, a bottom-emission type organic electroluminescence unit 2 generally includes a cathode layer, a pixel definition layer 21, a light emitting layer (which is provided in an opening of the pixel definition layer 21 and on the portion of the cathode layer exposed by the opening), and an anode layer, which are sequentially arranged on a base substrate 1 in accordance with their fabrication order. In the present embodiment, optionally, the first electrodes 5 and the second electrodes 6 are arranged at positions corresponding to the pixel definition layer 21. That is, an orthographic projection of the pixel definition layer 21 on the base substrate 1 completely covers the orthographic projections of the plurality of first electrodes 5 and the plurality of second electrodes 6 on the base substrate 1.

With such an arrangement, the first electrode 5 and the second electrode 6, which are arranged at the positions corresponding to the pixel definition layer 21 (i.e., a barrier configured to confine a position of light emitting layer in each pixel), may not shield the light emitting layer (i.e., the part of a pixel for displaying), thereby not affecting aperture ratio of the pixel.

Figure 4:
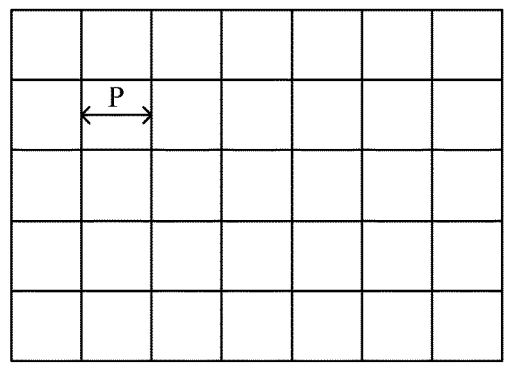
FIG. 4 is a schematic diagram illustrating a mesh pattern defined by first electrodes and second electrodes of an OLED substrate intersecting with each other according to embodiments of the present disclosure.
Figure 5:
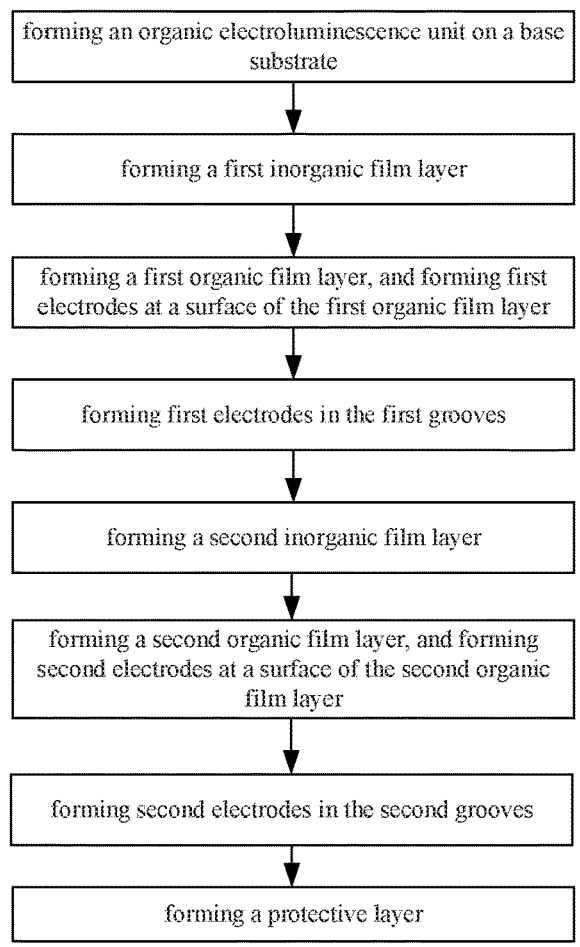
FIG. 5 is a flowchart illustrating a method of fabricating an OLED substrate according to embodiments of the present disclosure.

Optionally, as shown in FIG. 4, the plurality of first electrodes 5 and the plurality of second electrodes 6 intersect with each other (thereby defining a mesh pattern), and any two adjacent second electrodes 6 are spaced by a distance P of 100 µm to 2000 µm in a horizontal direction. Optionally, P is ranged from 300 µm to 1000 µm. Moreover, the distance P may have a value of integer times of the dimension (e.g., the width or the length) of the organic electroluminescence unit 2. It can be understood that the first electrode 5 has a width limited by a width of the first groove 8, and the second electrode 6 has a width limited by a width of the second groove 9.

In the present embodiment, the organic film layer 4 has a thickness larger than 3 µm, for example, from 3 µm to 12 µm, and further, from 4 µm to 8 µm. The inorganic film layer 3 is relatively thinner than the organic film layer 4, and optionally, the inorganic film layer 3 has a thickness ranging from 0.2 µm to 1.0 µm.

In the present embodiment, a width of each of the first groove 8 and the second groove 9 may be from 3 µm to 20 µm, for example, from 3 µm to 10 µm; and a depth of each of the first groove 8 and the second groove 9 may be from 1 µm to 5 µm, for example, from 2 µm to 4 µm.

In the present embodiment, each of the first electrode 5 and the second electrode 6 may include at least one of silver, gold, copper and aluminium. For example, the first electrode 5 and the second electrode 6 are made of silver. Needless to say, it would be sufficient that the first electrode 5 and the second electrode 6 are made of a conductive metal material.

In the OLED substrate according to embodiments of the present disclosure, the N numbers of inorganic film layers 3 and the N numbers of organic film layers 4 are alternately stacked on the organic electroluminescence unit 2 along the direction away from the base substrate 1 in an order of 1 to N, and the OLED substrate further includes a protective layer 7 on an N-th organic film layer 4.

Optionally, the protective layer 7 is an additional inorganic film layer 3 to prevent the organic electroluminescence unit 2 from being contaminated by external moisture and oxygen. Alternatively, the protective layer 7 is an additional organic film layer 4 to provide a planar surface.

In an example, the N numbers of inorganic film layers 3 and the N numbers of organic film layers 4 are alternately stacked on the organic electroluminescence unit 2 along the direction away from the base substrate 1 in an order of 1 to N, where N is an integer larger than 3. In this case, the first grooves 8 are arranged in an (N−1)-th organic film layer 4, and the second grooves 9 are arranged in an N-th organic film layer 4. By taking N=3 as an example, in this case, the first grooves 8 are arranged in the second organic film layer 4, and the second grooves 9 are arranged in the third organic film layer 4.

The reason for such an arrangement is that, the first grooves 8 and the second grooves 9 are to be filled with a conductive metal material to form the first electrodes 5 and the second electrodes 6, respectively, and in a case where the conductive metal material is arranged excessively close to the organic electroluminescence unit 2, the display of the organic electroluminescence unit 2 may be affected when signals are input through the conductive metal material. Therefore, the grooves are arranged in the organic film layers 4 that are farther away from the organic electroluminescence unit 2 among the N numbers of organic film layers 4. In addition, the (N−1)-th organic film layer 4 is provided with the first grooves 8 and the N-th organic film layer 4 is provided with the second grooves 9, so as to ensure that the first electrode 5 and the second electrode 6 can be closest to each other, such that a capacitance formed therebetween can be maximum, which in turn improves the touch sensitivity of the OLED substrate.

In another aspect, embodiments of the present invention further provide a method of fabricating an OLED substrate, which may be the OLED substrate of the above embodiment. Referring to FIGS. 5 to 13, the fabricating method according to the present embodiment will be described by taking N=2 as an example. Specifically, the method includes the following steps 1 to 8.

Figure 6:
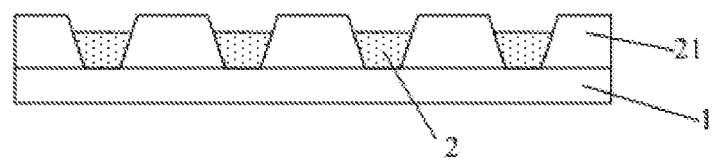
FIG. 6 is a schematic diagram illustrating step 1 of the method of fabricating an OLED substrate according to embodiments of the present disclosure.

At the step 1, an organic electroluminescence unit 2 and a pixel definition layer 21 are formed on a base substrate 1, as shown in FIG. 6. Herein, the organic electroluminescence unit 2 is of the top-emission type, as an example.

Specifically, the step 1 may include steps of: (1) forming, on the base substrate 1, a pattern including an anode layer by sputtering an anode conductive thin film and performing a patterning process; (2) forming, on the substrate 1 with the anode layer formed thereon, a pattern including the pixel definition layer 21 by performing a patterning process; (3) forming, on the substrate 1 with the pixel definition layer 21 formed thereon, a light emitting layer in an opening of the pixel definition layer 21 by performing a vacuum evaporation process; (4) forming, on the base substrate 1 with the light emitting layer formed thereon, a cathode layer by performing a vacuum evaporation process. To this end, the organic electroluminescence unit 2 of the present embodiment has been fabricated. Needless to say, the fabrication of the organic electroluminescence unit 2 may include fabrications of the functional film layers such as a hole injection layer, a hole transporting layer, an electron injection layer and an electron transporting layer, which will not be described herein in detail.

Figure 7:
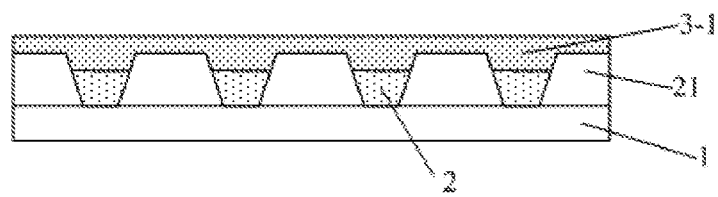
FIG. 7 is a schematic diagram illustrating step 2 of the method of fabricating an OLED substrate according to embodiments of the present disclosure.

At the step 2, a first inorganic film layer 3-1 is formed on the base substrate 1 subjected to the step 1, as shown in FIG. 7.

Specifically, the step 2 may include a step of: forming the first inorganic film layer 3-1 by using a reactive sputtering method in which a mixed gas of oxygen and argon is introduced into a vacuum environment and then the sputtering is performed. The first inorganic film layer 3-1 covers the organic electroluminescence unit 2 to prevent moisture and oxygen from entering into the organic electroluminescence unit 2 and affecting the service life of the organic electroluminescence unit 2.

Figure 8:
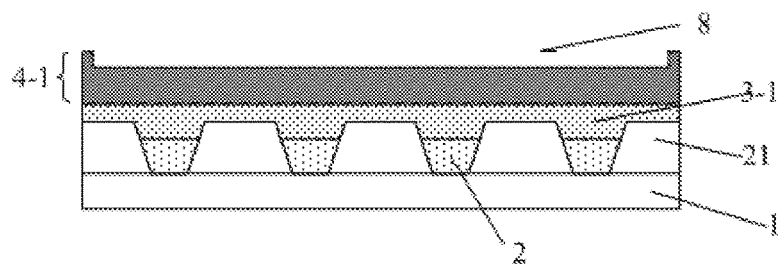
FIG. 8 is a schematic diagram illustrating step 3 of the method of fabricating an OLED substrate according to embodiments of the present disclosure.

At the step 3, a first organic film layer 4-1 is formed on the base substrate 1 subjected to the step 2, and first grooves 8 are formed at a surface of the first organic film layer 4-1, as shown in FIG. 8.

Specifically, the step 3 may include: firstly, forming the first organic film layer 4-1 by ink-jet printing (IJP) method; then, forming the first grooves 8 in the first organic film layer 4-1 by performing an imprinting process on the surface of the first organic film layer 4-1 distal to the base substrate 1. Here, the imprinting process on the surface of the first organic film layer 4-1 may be performed in a nitrogen ($N_2$) environment or a vacuum environment, for example, the imprinting process may be performed in an $N_2$ environment.

Figure 9:
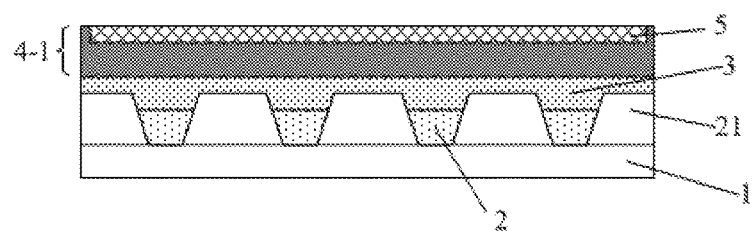
FIG. 9 is a schematic diagram illustrating step 4 of the method of fabricating an OLED substrate according to embodiments of the present disclosure.

At the step 4, first electrodes 5 are formed in the first grooves 8, as shown in FIG. 9.

Specifically, the step 4 may include: firstly, printing ink of metallic nano-particles (optionally, ink of silver nano-particles) in the first grooves 8 by ink-jet printing method; then, performing a conductive treatment on the metallic nano-particles to form the first electrodes 5, by using photon sintering method or laser pulse sintering method. It should be noted that the sintering process is used for sintering the ink of metallic nano-particles only within the first grooves 8 in high temperature, but would not affect the organic electroluminescence unit 2 underneath this film layer in which the first grooves 8 are located.

Figure 10:
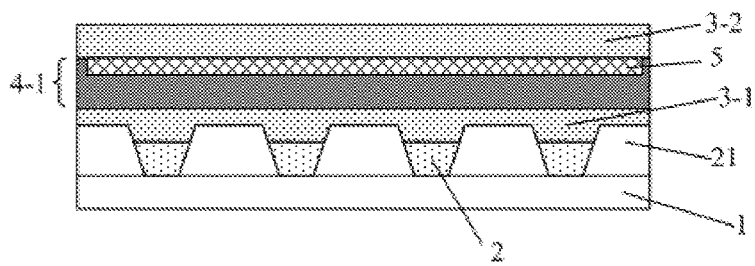
FIG. 10 is a schematic diagram illustrating step 5 of the method of fabricating an OLED substrate according to embodiments of the present disclosure.

At the step 5, similar to the step 2, a second inorganic film layer 3-2 is formed on the base substrate 1 subjected to the step 4, as shown in FIG. 10.

Figure 11:
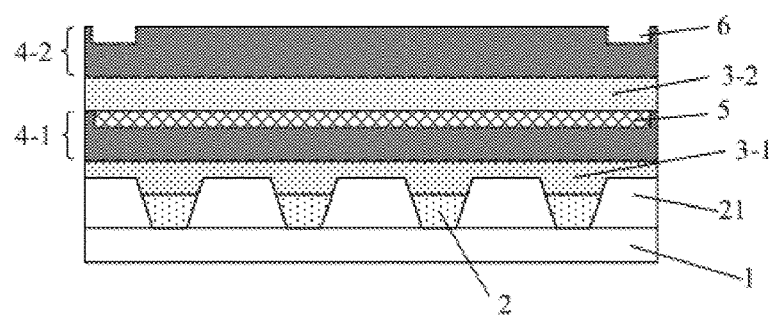
FIG. 11 is a schematic diagram illustrating step 6 of the method of fabricating an OLED substrate according to embodiments of the present disclosure.

At the step 6, similar to the step 4, a second organic film layer 4-2 is formed on the base substrate 1 subjected to the step 5, and second grooves 9 are formed in the second organic film layer 4-2. Here, the process of forming the second grooves 9 is the same as that of forming the first grooves 8, except that the second grooves 9 extend in a different direction from that of the first grooves 8. The first grooves 8 and the second grooves 9 intersect with each other, as shown in FIG. 11.

Figure 12:
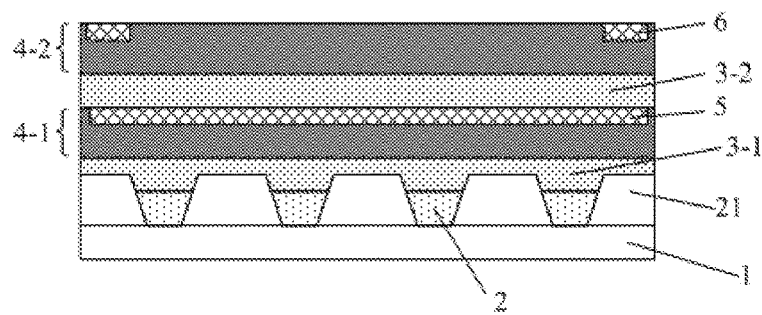
FIG. 12 is a schematic diagram illustrating step 7 of the method of fabricating an OLED substrate according to embodiments of the present disclosure.

At the step 7, second electrodes 6 are formed in the second grooves 9, as shown in FIG. 12. Here, the process of forming the second electrodes 6 is the same as that of forming the first electrodes 5, and will be omitted here.

Figure 13:
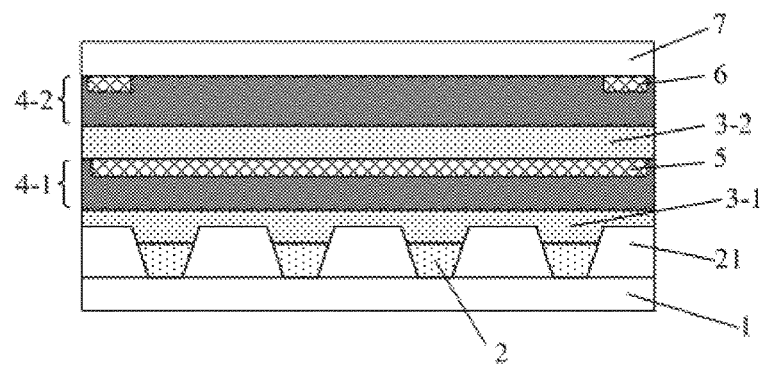
FIG. 13 is a schematic diagram illustrating step 8 of the method of fabricating an OLED substrate according to embodiments of the present disclosure.

Needless to say, after the step 7, a protective layer 7 may be formed (step 8) on the base substrate 1 with the second electrodes 6 formed thereon according to design needs of the OLED substrate, as shown in FIG. 13. Here, the protective layer 7 may be a third inorganic film layer 3 to avoid external contaminants such as moisture and oxygen; alternatively, the protective layer 7 may be a third organic film layer 4 to make the substrate to have a planar surface.

To this end, the fabrication of the OLED substrate according to the present embodiment is finished. The above description is merely made by way of example with respect to the OLED substrate having two pairs of the thin film layers. Similarly, when N is an integer equal to or larger than 3 (i.e., when the OLED substrate has three pairs of the thin film layers or more), the fabrication method is similar to the above method, that is, any one of the organic film layers 4 may be selected and provided with the first grooves 8 as well as the first electrodes 5 formed in the first grooves 8; and another one of the organic film layers 4 may be selected and provided with the second grooves 9 as well as the second electrodes 6 formed in the second grooves 9. In this case, the organic film layer 4 formed with the first grooves 8 therein may be an (N−1)-th organic film layer, and the organic film layer 4 formed with the second grooves 9 therein may be an N-th organic film layer.

In another aspect, embodiments of the present disclosure provide a display apparatus including any one of the above OLED substrates, thereby having a high integration level and various functions, and being applicable to flexible display.

The display apparatus may be any products or parts having display function, such as an electronic paper, an OLED panel, a mobile phone, a tablet computer, a television, a monitor, a notebook computer, a digital album, a GPS, etc.

It should be understood that the above implementations are merely exemplary implementations adopted for explaining the principle of the present disclosure, but the present disclosure is not limited thereto. For those skilled in the art, various modifications and improvements may be made without departing from the spirit and essence of the present disclosure, and these modifications and improvements are also considered to be within the protection scope of the present disclosure.

What is claimed is:

1. An organic light emitting diode (OLED) substrate, comprising:
    a base substrate;
    an organic electroluminescence unit on the base substrate;
    a thin film encapsulation layer on the organic electroluminescence unit; and
    a plurality of first electrodes and a plurality of second electrodes in the thin film encapsulation layer,
    wherein the thin film encapsulation layer comprises N numbers of inorganic film layers and N numbers of organic film layers, where N is an integer equal to or larger than 2, the N numbers of inorganic film layers and the N numbers of organic film layers are alternately stacked on the organic electroluminescence unit along a direction away from the base substrate, and each of the N numbers of organic film layers is stacked on a respective one of the N numbers of inorganic film layers,
    and wherein the plurality of first electrodes are embedded in one of the N numbers of organic film layers, and the plurality of second electrodes are embedded in another one of the N numbers of organic film layers.

2. The OLED substrate of claim 1, wherein the one organic film layer is provided with a plurality of first grooves; the another one organic film layer is provided with a plurality of second grooves; and the plurality of first grooves and the plurality of second grooves are arranged such that orthographic projections of the plurality of first grooves on the base substrate intersect with orthographic projections of the plurality of second grooves on the base substrate; wherein each of the plurality of first grooves is filled with a respective one of the plurality of first electrodes, and each of the plurality of second grooves is filled with a respective one of the plurality of second electrodes.

3. The OLED substrate of claim 2, wherein each of the first and second grooves has a width of 3 μm to 20 μm.

4. The OLED substrate of claim 2, wherein each of the first and second grooves has a depth of 1 μm to 5 μm.

5. The OLED substrate of claim 1, further comprising a pixel definition layer on the base substrate, the pixel definition layer defining the organic electroluminescence unit,
    wherein an orthographic projection of the pixel definition layer on the base substrate completely covers the orthographic projections of the plurality of first electrodes and the plurality of second electrodes on the base substrate.

6. The OLED substrate of claim 5, wherein the organic electroluminescence unit comprises an anode layer, a light emitting layer and a cathode layer; wherein
    the anode layer is on the base substrate, the pixel definition layer is on the anode layer and has an opening to expose a portion of the anode layer, the light emitting layer is within the opening of the pixel definition layer and on the portion of the anode layer exposed by the opening, and the cathode layer is on the pixel definition layer and the light emitting layer.

7. The OLED substrate of claim 5, wherein the organic electroluminescence unit comprises an anode layer, a light emitting layer and a cathode layer; wherein
    the cathode layer is on the base substrate, the pixel definition layer is on the cathode layer and has an opening to expose a portion of the cathode layer, the light emitting layer is within the opening of the pixel definition layer and on the portion of the anode layer exposed by the opening, and the anode layer is on the pixel definition layer and the light emitting layer.

8. The OLED substrate of claim 1, wherein any two adjacent second electrodes are spaced by a distance of 100 μm to 2000 μm in a horizontal direction.

9. The OLED substrate of claim 1, wherein the first electrodes and the second electrodes include at least one of silver, gold, copper and aluminium.

10. The OLED substrate of claim 1, wherein the organic film layer has a thickness of 3 μm to 12 μm.

11. The OLED substrate of claim 1, wherein the inorganic film layer has a thickness of 0.2 μm to 1.0 μm.

12. The OLED substrate of claim 1, wherein N is equal to or larger than 3, the N numbers of inorganic film layers and the N numbers of organic film layers are alternately stacked on the organic electroluminescence unit along the direction away from the base substrate in an order of 1 to N, the first electrodes are in an (N−1)-th organic film layer, and the second electrodes are in an N-th organic film layer.

13. The OLED substrate of claim 1, wherein the N numbers of inorganic film layers and the N numbers of organic film layers are alternately stacked on the organic electroluminescence unit along the direction away from the base substrate in an order of 1 to N, and the OLED substrate further comprises a protective layer on an N-th organic film layer.

14. The OLED substrate of claim 13, wherein the protective layer is an inorganic film layer or an organic film layer.

15. A method of fabricating an organic light emitting diode (OLED) substrate, wherein the OLED substrate is the OLED substrate according to claim 1, and the method comprises steps of:
    forming the organic electroluminescence unit and a pixel definition layer on the base substrate; and
    forming, on the organic electroluminescence unit, the thin film encapsulation layer, and the plurality of first electrodes and the plurality of second electrodes in the thin film encapsulation layer,
    wherein the step of forming the thin film encapsulation layer, the plurality of first electrodes and the plurality of second electrodes comprises steps of:
    forming the N numbers of inorganic film layers and the N numbers of organic film layers on the organic electroluminescence unit in a manner of alternately stacking the inorganic film layers and the organic film layers along the direction away from the base substrate, each of the N numbers of organic film layers being stacked on a respective one of the N numbers of inorganic film layers;
    forming, after formation of one of the N numbers of organic film layers and before formation of one of the N numbers of inorganic film layers that is directly stacked on the one organic film layer, a plurality of first grooves in the one organic film layer, and forming, in each first groove, a respective one of the plurality of first electrodes; and forming, after formation of another one of the N numbers of organic film layers and before formation of another one of the N numbers of inorganic film layer that is directly stacked on the another one organic film layer, a plurality of second grooves in the another one organic film layer, the plurality of first grooves and the plurality of second grooves being formed so that orthographic projections of the plurality of first grooves on the base substrate intersect with orthographic projections of the plurality of second grooves on the base substrate, and forming, in each first groove, a respective one of the plurality of second electrodes.

16. The method of claim 15, wherein the step of forming the organic film layer comprises forming the organic film layer by ink-jet printing method.

17. The method of claim 15, wherein the step of forming the plurality of first grooves in the one organic film layer includes forming the plurality of first grooves in the one organic film layer by performing an imprinting process on a surface of the one organic film layer distal to the base substrate; and the step of forming the plurality of second grooves in the another one organic film layer includes forming the plurality of second grooves in the another one organic film layer by performing an imprinting process on a surface of the another one organic film layer distal to the base substrate.

18. The method of claim 17, wherein the imprinting process is performed in a nitrogen environment or a vacuum environment.

19. The method of claim 15, wherein the step of forming the first electrodes in the first grooves comprises steps of:

printing ink of metallic nano-particles in the first grooves by ink-jet printing method; and performing a conductive treatment on the metallic nano-particles to form the first electrodes, by using photon sintering method or laser pulse sintering method; and the step of forming the second electrodes in the second grooves includes steps of: printing ink of metallic nano-particles in the second grooves by ink-jet printing method; and performing a conductive treatment on the metallic nano-particles to form the second electrodes, by using photon sintering method or laser pulse sintering method.

20. A display apparatus, comprising the organic light emitting diode substrate according to claim 1.

* * * * *